(12) United States Patent
Kim et al.

(10) Patent No.: US 12,106,977 B2
(45) Date of Patent: Oct. 1, 2024

(54) SUBSTRATE PROCESSING APPARATUS HAVING A MIDDLE ELECTRODE

(71) Applicant: SK hynix Inc., Icheon-si (KR)

(72) Inventors: Jin Ho Kim, Icheon-si (KR); Sang Hyun Sung, Icheon-si (KR); Sung Lae Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 78 days.

(21) Appl. No.: 17/332,827

(22) Filed: May 27, 2021

(65) Prior Publication Data

US 2022/0230894 A1 Jul. 21, 2022

(30) Foreign Application Priority Data

Jan. 19, 2021 (KR) .................. 10-2021-0007395

(51) Int. Cl.
*H01L 21/67* (2006.01)
*H01J 37/32* (2006.01)

(52) U.S. Cl.
CPC .. *H01L 21/67069* (2013.01); *H01J 37/32568* (2013.01); *H01J 37/32697* (2013.01); *H01J 37/3244* (2013.01); *H01J 37/32642* (2013.01); *H01J 37/32715* (2013.01); *H01J 2237/202* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 6,184,489 B1 * | 2/2001 | Ito | ............ | H01J 37/32431 |
| | | | | 156/345.47 |
| 6,714,033 B1 * | 3/2004 | Makhratchev | .... | H01J 37/32935 |
| | | | | 324/754.03 |
| 7,651,586 B2 * | 1/2010 | Moriya | ............ | H01J 37/32431 |
| | | | | 156/345.47 |
| 7,883,602 B2 * | 2/2011 | Dong | ............ | B23K 35/268 |
| | | | | 156/345.51 |
| 8,834,674 B2 * | 9/2014 | Motokawa | ............ | G03F 1/80 |
| | | | | 156/345.47 |
| 8,845,856 B2 * | 9/2014 | Kang | ............ | H01J 37/32642 |
| | | | | 156/345.46 |
| 9,236,226 B2 * | 1/2016 | Yamawaku | ........ | H01J 37/32669 |
| 9,275,837 B2 * | 3/2016 | Yamazawa | ........ | H01J 37/32091 |
| 2011/0181313 A1 * | 7/2011 | Sasaki | ............ | H01L 21/67109 |
| | | | | 324/750.03 |
| 2012/0241092 A1 * | 9/2012 | Yamawaku | ........ | H01J 37/32091 |
| | | | | 156/345.46 |
| 2019/0348315 A1 * | 11/2019 | Tanikawa | ............ | B08B 5/02 |
| 2020/0083026 A1 * | 3/2020 | Ichino | ............ | H01J 37/32715 |
| 2022/0230894 A1 * | 7/2022 | Kim | ............ | H01L 21/67069 |

FOREIGN PATENT DOCUMENTS

KR 10-1115439 B1 5/2005

\* cited by examiner

*Primary Examiner* — Sylvia Macarthur

(57) ABSTRACT

A substrate processing apparatus may include a vacuum chamber, a substrate supporting unit disposed at lower portion of an inside of the vacuum chamber, and an electric field forming unit forming an electric field inside the vacuum chamber. The electric field forming unit may include an upper electrode disposed at an upper portion of the inside of the vacuum chamber, a lower electrode disposed in the substrate supporting unit, and a middle electrode disposed between the upper electrode and the lower electrode.

15 Claims, 7 Drawing Sheets

SUBSTRATE PROCESSING APPARATUS HAVING A MIDDLE ELECTRODE

CROSS-REFERENCE TO RELATED APPLICATION

This application claims priority under 35 U.S.C. § 119(a) to Korean Patent Application No. 10-2021-0007395 filed on Jan. 19, 2021, which is incorporated herein by reference in its entirety.

BACKGROUND

1. Technical Field

Embodiments of the disclosure provide a substrate processing apparatus having a middle electrode and a method of processing a substrate using the substrate processing apparatus.

2. Related Art

Recently, as semiconductor devices have been minimized and highly multilayered, the difficulty of processing a substrate (e.g., a semiconductor wafer) with etching processes is increasing. In order to form a pattern having a high aspect ratio, a metallic hard mask having excellent etching selectivity is used, but it is difficult to withstand etching damage even with a metallic hard mask.

SUMMARY

A substrate processing apparatus in accordance with an embodiment of the disclosure may include a vacuum chamber, a substrate supporting unit disposed at lower portion of an inside of the vacuum chamber, and an electric field forming unit forming an electric field inside the vacuum chamber. The electric field forming unit may include an upper electrode disposed at an upper portion of the inside of the vacuum chamber, a lower electrode disposed in the substrate supporting unit, and a middle electrode disposed between the upper electrode and the lower electrode.

A substrate processing apparatus in accordance with an embodiment of the disclosure may include a vacuum chamber, a gas supplying unit configured to supply gases into the vacuum chamber, a supporting plate disposed at a lower portion of an inside of the vacuum chamber, an upper electrode disposed at an upper portion of the inside of the vacuum chamber, a lower electrode disposed in the supporting plate, and a middle electrode adjacent to an upper surface of the supporting plate. The middle electrode may include an end portion configured to physically contact an edge region of a wafer on the supporting plate.

A method of processing a substrate in accordance with an embodiment of the disclosure may include loading a wafer onto a supporting plate of a substrate supporting unit in a vacuum chamber, evacuating the vacuum chamber using a gas exhausting unit, supplying one of a reactive gas, a precursor, or a plasma into the vacuum chamber using a gas supplying unit, and processing the wafer using an electric field forming unit. Using the electric field forming unit may include forming an electric field. Forming an electric field may include applying an upper electrode voltage to an upper electrode, applying a lower electrode voltage to a lower electrode, and applying a middle electrode voltage to a middle electrode. The middle electrode is physically in contact with the wafer.

DETAILED DESCRIPTION

Embodiments of the disclosure provide a substrate processing apparatus having a middle electrode and a method of processing a substrate using the substrate processing apparatus.

Embodiments of the disclosure provide a method and a process for applying a voltage to a metallic hardmask of a wafer in processing a substrate.

Figure 1:
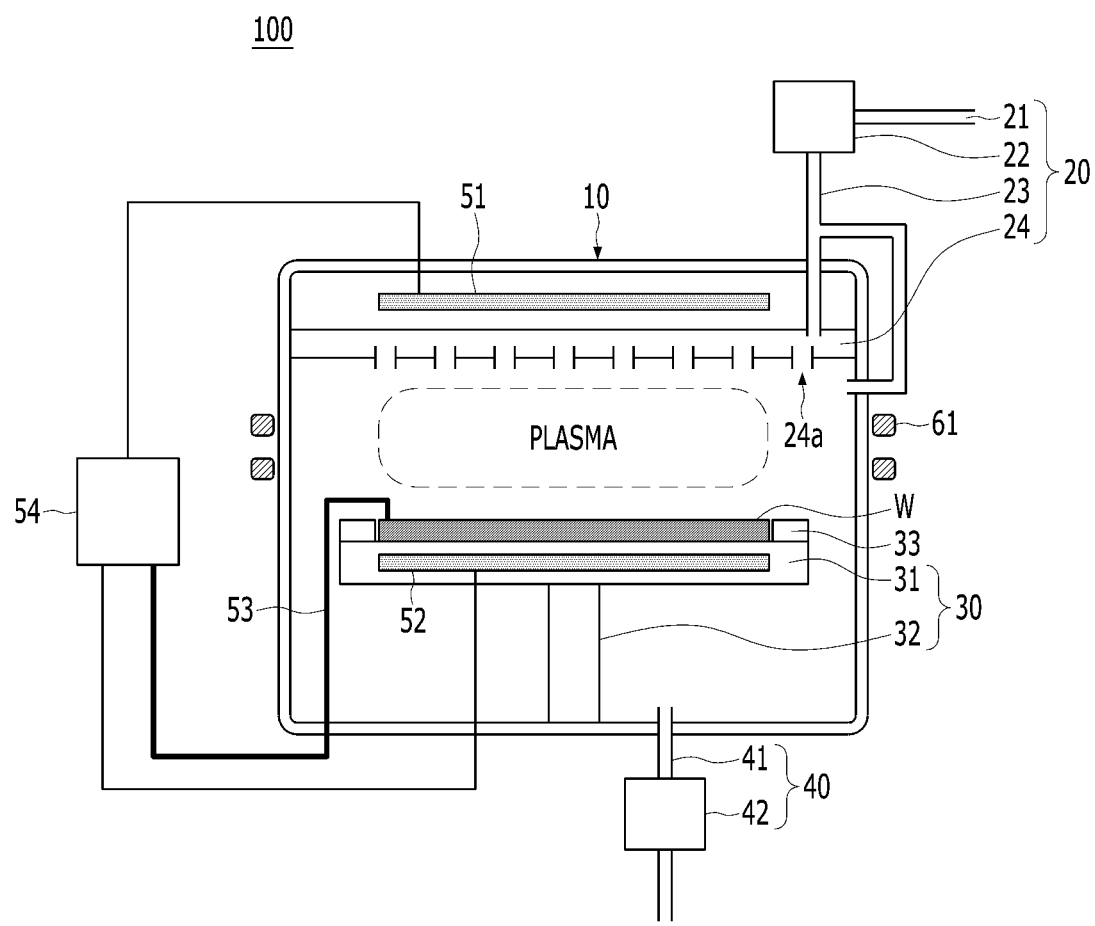
FIG. 1 is a schematic structural diagram of a substrate processing apparatus according to an embodiment of the disclosure.

FIG. 1 is a schematic structural diagram of a substrate processing apparatus 100 according to an embodiment of the disclosure. Referring to FIG. 1, a substrate processing apparatus 100 according to an embodiment may include a vacuum chamber 10, a gas supplying unit 20, a substrate supporting unit 30, a gas exhausting unit 40, and electric field forming units 51 to 54.

The gas supplying unit 20 may supply, from outside of the vacuum chamber 10, various reactive gases, precursors, or plasmas into the vacuum chamber 10. The reactive gases may include at least one of a gas for an etching process, a gas for a depositing process, a gas for a purging process, and a gas for a cleaning process. The gas supplying unit 20 may include a gas supplying pipe 21, a mass flow meter 22, a gas delivery pipe 23, and a gas distribution unit 24. The gas supplying pipe 21 may supply gases to the mass flow meter 22 from a gas tank or a gas reservoir. Although only one gas supply pipe 21 is shown in the drawing, the gas supply pipe 21 may include a plurality of sub-gas supply pipes (not illustrated). The mass flow meter 22 may control a flow rate of various gases as the gases are transferred into the vacuum chamber 10. Although only one mass flow meter 22 is shown in the drawing, the mass flow meter 22 may include a plurality of sub-mass flow meters (not illustrated). The gas delivery pipe 23 may deliver the reactive gases, the precursors, or the plasmas from the mass flow meter 22 to the gas distribution unit 24 disposed in the vacuum chamber 10. The gas delivery pipe 23 may deliver and supply the reactive gases, the precursors, or the plasmas into the vacuum chamber 10 through an upper portion and/or a side portion of the vacuum chamber 10. The gas distribution unit 24 may uniformly distribute the reactive gases, the precursors, or the plasmas into the vacuum chamber 10. In an embodiment, the gas distribution unit 24 may include a shower head. For example, the gas distribution unit 24 may include a plurality of gas injection openings 24a. In an embodiment, the gas distribution unit 24 may include a baffle plate.

The substrate supporting unit 30 may be disposed at a lower portion of inside of the vacuum chamber 10. The substrate supporting unit 30 may include a supporting plate 31 and an actuator 32. A substrate (e.g., a wafer) W may be loaded on the supporting plate 31. In an embodiment, the supporting plate 31 may include an electro-static chuck (ESC). In an embodiment, the supporting plate 31 may include a vacuum chuck. The actuator 32 may perform a rising operation, a descending operation, and a rotating operation. Accordingly, the supporting plate 31 can be raised, lowered, and rotated by the operations of the actuator 32.

The gas exhausting unit 40 may include a gas exhausting pipe 41 and a vacuum pump 42. The gas exhausting pipe 41 may transmit the reactive gases, the precursors, and the plasmas from the inside of the vacuum chamber 10 to the vacuum pump 42. The vacuum pump 42 may exhaust the reaction gases, the precursors, and the plasmas from the inside of the vacuum chamber 10 to outside of the vacuum chamber 10. The vacuum pump 42 may evacuate gases inside of the vacuum chamber 10.

The substrate processing apparatus 100 may further include coils 61 disposed outside the vacuum chamber 10. The coils 61 may form a magnetic field inside of the vacuum chamber 10. The coils 61 may be disposed on a sidewall of the vacuum chamber 10. In an embodiment, the coils 61 may be disposed above the vacuum chamber 10.

The electric field forming units 51 to 54 may include an upper electrode 51, a lower electrode 52, a middle electrode 53, and a controller 54. The upper electrode 51 may be disposed at an upper portion of inside of the vacuum chamber 10. The upper electrode 51 may be disposed above the gas distribution unit 24 of the gas supplying unit 20. The lower electrode 52 may be embedded or disposed in the supporting plate 31. In an embodiment, the lower electrode 52 may be disposed below the supporting plate 31. The upper electrode 51 and the lower electrode 52 may form a plasma P in the vacuum chamber 10 and may form an electric field to allow reaction of the plasma P with the wafer W.

The middle electrode 53 may be disposed adjacent to the supporting plate 31 of the substrate supporting unit 30. In an embodiment, the middle electrode 53 may be disposed adjacent to an upper surface of the supporting plate 31. In an embodiment, the middle electrode 53 may be disposed adjacent to a side surface of the supporting plate 31. The substrate supporting unit 30 may further include an edge ring 33 disposed on an edge portion of the supporting plate 31. The edge ring 33 may be mounted on the supporting plate 31, and may be configured to be coupled to and separated from the supporting plate 31. The edge ring 33 may include an insulating material such as quartz. In an embodiment, the middle electrode 53 may be disposed adjacent to the edge ring 33 disposed on the supporting plate 31. In an embodiment, the middle electrode 53 may penetrate the edge ring 33 of the supporting plate 31. In an embodiment, the middle electrode 53 may be embedded in the edge ring 33. The middle electrode 53 may be in contact with the wafer W. The middle electrode 53 may be electrically in contact with a conductive material layer disposed on an uppermost portion of the wafer W. For example, the middle electrode 53 may be directly in contact with the conductive material layer of the wafer W or may be capacitively connected with the conductive material layer of the wafer W. By inserting a dielectric between the middle electrode 53 and the conductive material layer of the wafer W, an electrical connection between the middle electrode 53 and the wafer W may be substantially formed. In an embodiment, the substrate processing apparatus 100 may include at least two middle electrodes 53 disposed along a periphery of the supporting plate 31 of the substrate supporting unit 30. Accordingly, the middle electrodes 53 and the wafer W may have two or more contact points.

The controller 54 may apply a voltage to the upper electrode 51, the lower electrode 52, and the middle electrode 53. The controller 54 may periodically change the voltage. For example, the controller 54 may adjust the voltage applied to the upper electrode 51, the lower electrode 52, and the middle electrode 53 so that applied voltage levels vary, independently.

FIGS. 2A to 2D, and 3A and 3B are views illustrating a middle electrode 53 in contact with an upper surface of a wafer W. The wafer W may include a lower layer 71, a middle layer 72, and an upper layer 73. The lower layer 71 may include an etch target layer. For example, the lower layer 71 may include one of a silicon substrate, a silicon oxide layer, a silicon nitride layer, or other non-conductive material layer. The middle layer 72 may include a conductive material layer. For example, the middle layer 72 may include a metallic etch mask layer. The upper layer 73 may include a non-conductive material layer. For example, the upper layer 73 may include a photoresist pattern. The middle electrode 53 may be physically or electrically in contact with the middle layer 72 of the wafer W. For example, the middle electrode 53 may penetrate the upper layer 73 of the wafer W to be in contact with an edge region of the middle layer 72. Because the middle layer 72 may be entirely formed on the lower layer 71 of the wafer W, the middle layer 72 may be parallel to the lower electrode 52 in the supporting plate 31. Accordingly, the middle layer 72 and the lower electrode 52 may form electrodes of a capacitor. The middle electrode 53 may have a stick-like or rod-like shape. An end of the middle electrode 53 may taper into a point and may have a needle-like shape. A needle-shaped end portion of the middle electrode 53 may be rounded or may end in a substantially flat surface.

Figure 2A:
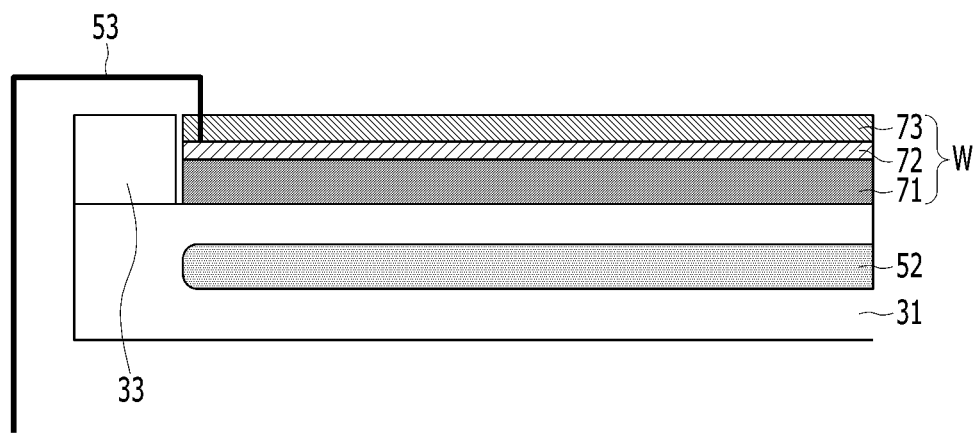
FIGS. 2A to 2D, and 3A and 3B are views illustrating a middle electrode in contact with an upper surface of a wafer.
Figure 2B:
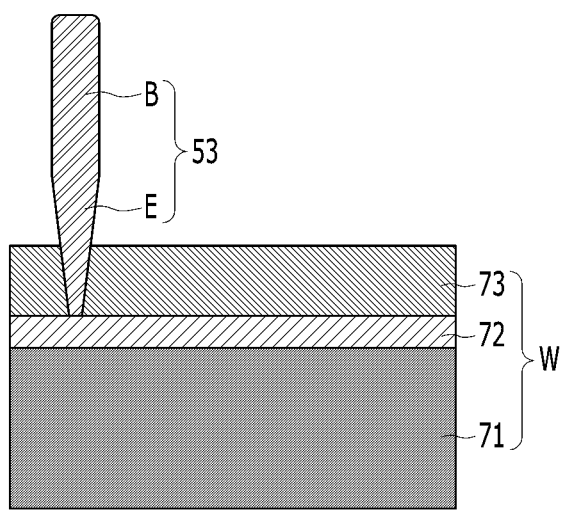

Referring to FIG. 2B, the middle electrode 53 may include a body portion B and an end portion E. The end portion E may directly contact the wafer W. The body portion B may have a vertical pillar shape. The cross-section of the body portion B may have different shapes in different embodiments. For example, the body portion B may have vertical side surfaces that are substantially flat. The end portion E may have an inverted cone shape, an inverted pyramid shape, or an inverted wedge shape. The end portion E may have a pointed shape and may physically penetrate the upper layer 73. For example, the distal or furthest end of the end portion E may have a needle shape or a pinnacle shape. In an embodiment, the distal or furthest point of the end portion E may be rounded. The body portion B and the end portion E of the middle electrode 53 may include a conductor such as metal.

Figure 2C:
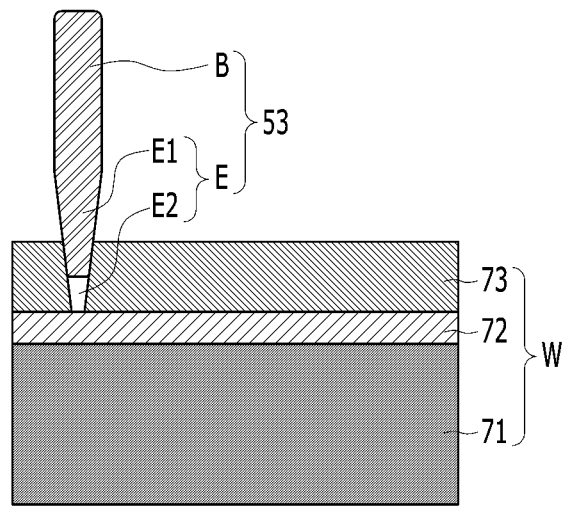

Referring to FIG. 2C, the end portion E of the middle electrode 53 may include a pointed end tip E2 and an end body E1 that may have an inclined side surface. The end tip E2 may include an insulating material such as Teflon or a plastic. The end tip E2 may be formed from a material that is harder than the material used to form upper layer 73 of the wafer W, which may facilitate the physical penetration of the upper layer 73 of the wafer W.

Figure 2D:
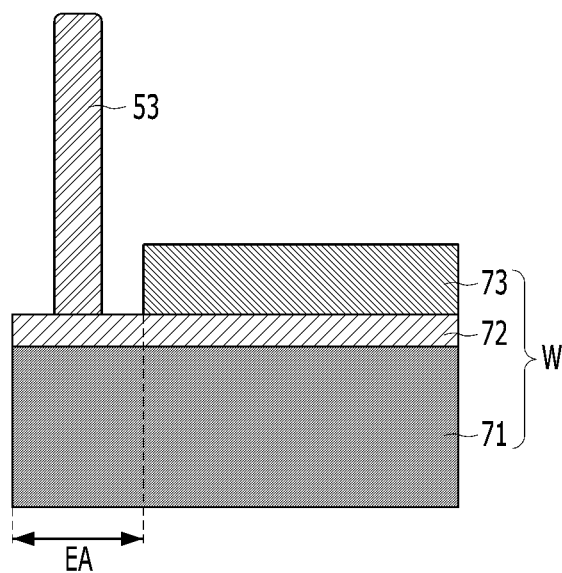

Referring to FIG. 2D, the wafer W may include an exposed edge area EA, and the middle electrode 53 may be directly in contact with the middle layer 72 that is exposed in the edge area EA. In the edge area EA of the wafer W, a part of the upper layer 73 may be removed to expose the middle layer 72. The end portion of the middle electrode 53 may differ in various embodiments with or without exposed edge area EA. For example, referring to FIG. 2B, the middle electrode 53 may include the end portion E. Referring to FIG. 2C, the middle electrode 53 may include the end body E1 and the end tip E2. The end portion of the middle electrode 53 may be rounded or flat. Thus, the inventive concepts described with reference to FIGS. 2B to 2D may be compatible with each other and with embodiments with or without an exposed edge area EA.

Figure 3A:
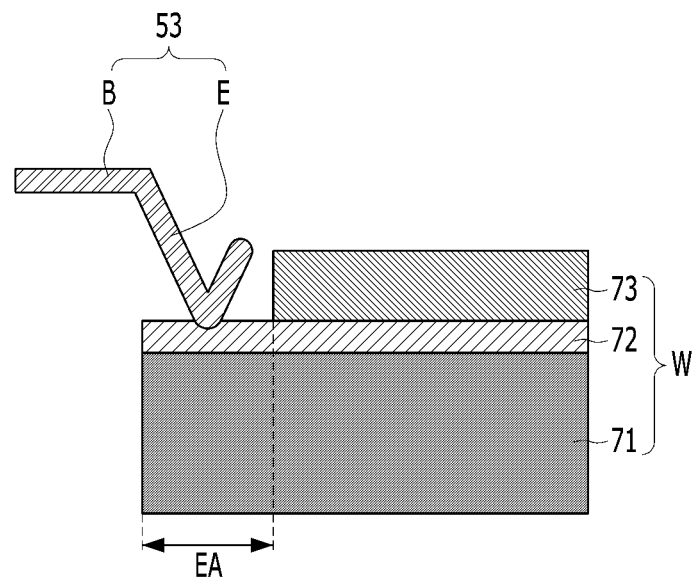
Figure 3B:
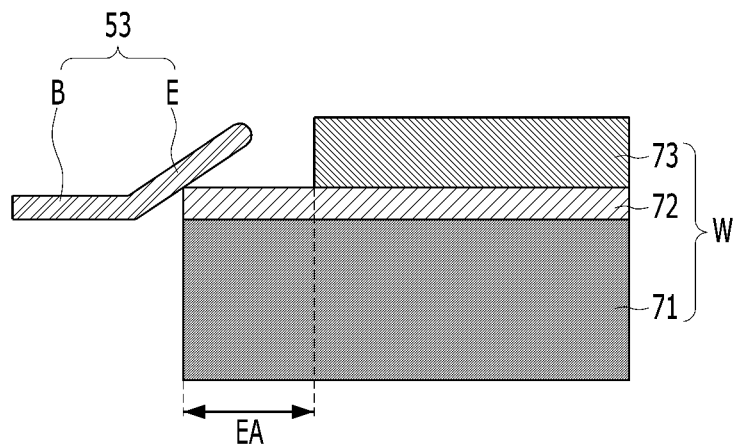

Referring to FIGS. 3A and 3B, the middle electrode 53 may include a body portion B and an end portion E. The body portion B may have elasticity. For example, the body portion B may have a flat spring or a stick shape having elastic properties. The end portion E of the middle electrode 53 may have a bent shape. For example, the end portion E of the middle electrode 53 may have an elbow shape or a bracket shape. The end portion E of the middle electrode 53 may also have elasticity. In an embodiment, the body portion B of the middle electrode 53 may have a horizontal bar or horizontal stick shape disposed to extend horizontally. In an embodiment, the middle electrode 53 may have an inclined shape. For example, the middle electrode 53 may form an angle in a range of 0° to 90° with respect to a top surface of the middle layer 72 of the wafer W.

Referring to FIG. 3A, the end portion E may have a curved or bent shape with a vertex protruding downwardly. At the lowest end or the point of the vertex, the end portion E may descend and rise to be rounded or to have a V-shape so that the end portion E of the middle electrode 53 and the middle layer 72 of the wafer W may be in contact with each other.

Referring to FIG. 3B, the end portion E may have a sliding bar shape or a segment shape inclined with respect to the body portion B. For example, the end portion E may form an angle in a range of 0° to 90° with respect to the body portion B. The middle electrode 53 or the wafer W may translate in a horizontal direction so that the end portion E and the middle layer 72 of the wafer W may be in contact with each other. The end portion E of the middle electrode 53 may slide onto an edge of the middle layer 72 of the wafer W. In other embodiments, the middle electrode 53 or the wafer W may translate in the vertical direction so that the end portion E of the middle electrode 53 and the middle layer 72 of the wafer W are in contact with each other.

Figure 4A:
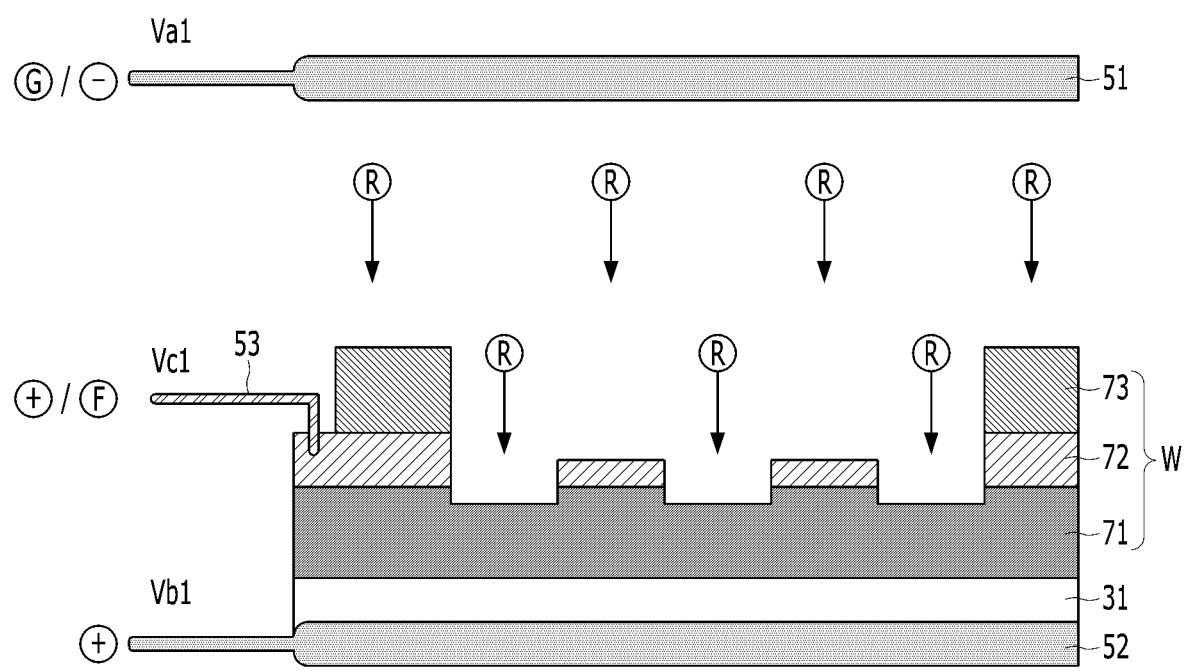
FIGS. 4A to 4C are views illustrating a wafer processed using the substrate processing apparatus according to an embodiment of the disclosure.
Figure 4B:
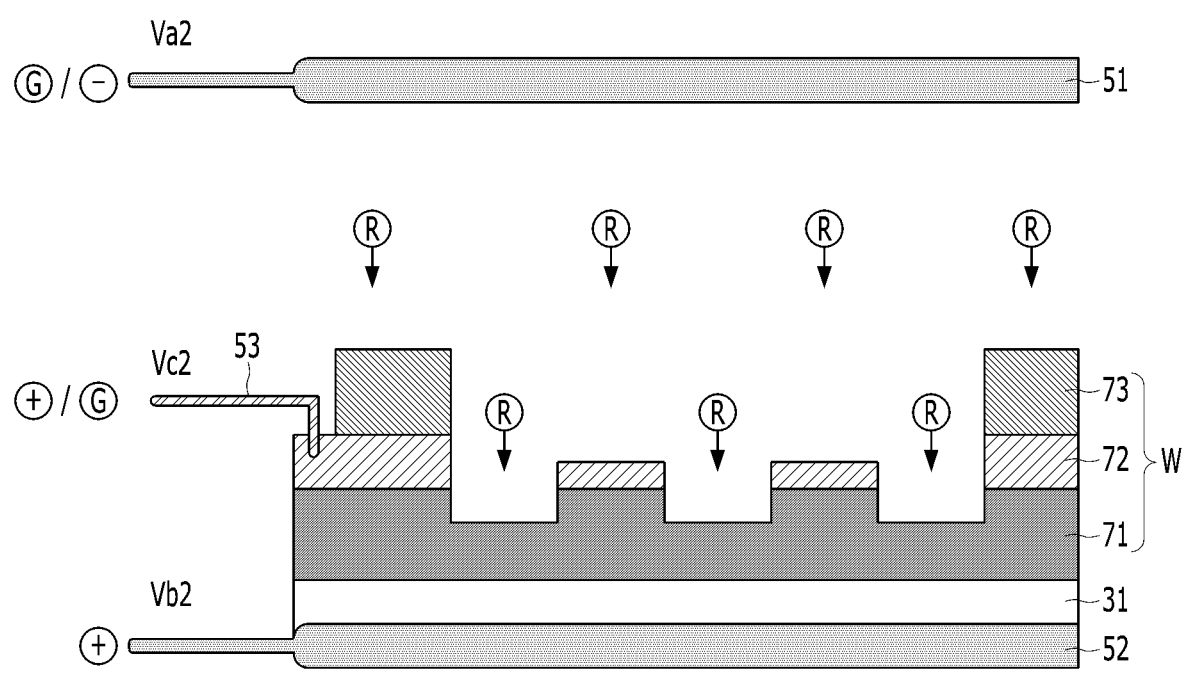
Figure 4C:
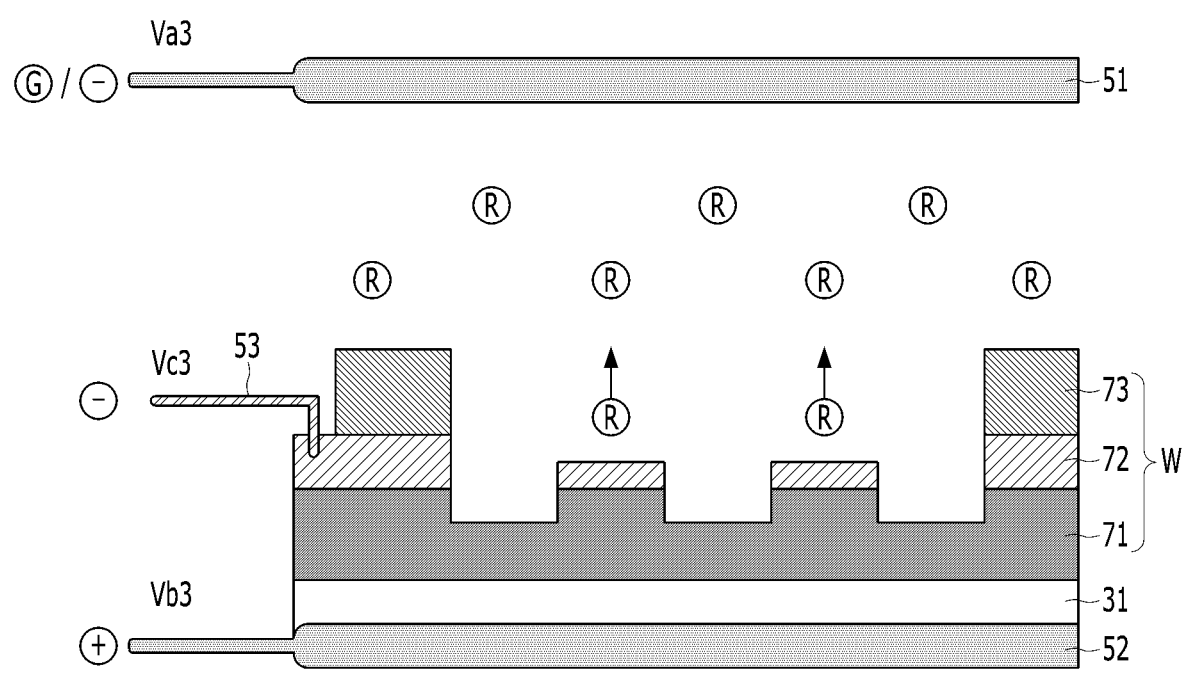

FIGS. 4A to 4C are views illustrating a wafer W processed using the substrate processing apparatus 100 according to an embodiment of the disclosure. For example, a process of selectively etching the wafer W using reactors R will be described.

Referring to FIGS. 1 and 4A, a method of etching the wafer W using the substrate processing apparatus 100 may include loading the wafer W on the supporting plate 31 of the substrate supporting unit 30 in the vacuum chamber 10, creating a vacuum inside of the vacuum chamber 10 using the gas exhausting unit 40, supplying at least one of the reaction gas, the precursors, or plasmas into the vacuum chamber 10 using the gas supply unit 20, and processing the wafer W using the electric field forming units 51 to 54.

Processing the wafer W using the electric field forming units 51 to 54 may include applying a first upper electrode voltage Va1 to the upper electrode 51, applying a first lower electrode voltage Vb1 to the lower electrode 52, and applying a first middle electrode voltage Vc1 to the middle electrode 53 to perform the substrate processing process in a first period. The first upper electrode voltage Va1 may be a ground voltage or a negative (−) voltage, the first lower electrode voltage Vb1 may be a positive (+) voltage, and the first middle electrode voltage Vc1 may be a positive voltage or a floating voltage. The floating voltage may be a state in which no voltage is applied to the middle electrode 53. Due to the electric field that develops between the upper electrode 51 and the lower electrode 52, the reactors R are strongly subjected to the electric field and move relatively quickly, from a periphery of the upper electrode 51 to the surface of the wafer W, and in the subsequent reactions, the lower layer 71, the middle layer 72, and the upper layer 73 of the wafer W may be etched. In this case, the upper layer 73 of the wafer W may selectively expose a part of the lower layer 71 and a part of the middle layer 72. The middle layer 72 of the wafer W may selectively expose a part of the lower layer 71. Accordingly, the reactors R may partially remove the exposed lower layer 71 and the exposed middle layer 72 of the wafer W. The lower layer 71 may be etched more easily than the middle layer 72 due to an etching selectivity. In an embodiment, the first upper electrode voltage Va1 and the first lower electrode voltage Vb1 may be interchanged. For example, the same voltage as the first lower electrode voltage Vb1 may be applied to the upper electrode 51, and the same voltage as the first upper electrode voltage Va1 may be applied to the lower electrode 52. In an embodiment, the first middle electrode voltage Vc1 may be a middle voltage that falls between the first upper electrode voltage Va1 and the first lower electrode voltage Vb1. In an embodiment, the middle layer 72 may be completely covered with the upper layer 73 and might not be etched. For example, the exposed lower layer 71 and the upper layer 73 may be partially removed.

Referring to FIGS. 1 and 4B, a method of processing the wafer W using the substrate processing apparatus 100 may include applying a second upper electrode voltage Va2 to the upper electrode 51, applying a second lower electrode voltage Vb2 to the lower electrode 52, and applying a second middle electrode voltage Vc2 to the middle electrode 53 to perform the substrate processing process in a second period. The second upper electrode voltage Va2 may be a ground voltage or a negative (−) voltage, the second lower electrode voltage Vb2 may be a higher positive (+) voltage, and the second middle electrode voltage Vc2 may be a positive (+) voltage lower than Vb2 or a ground voltage. For example, the second middle electrode voltage Vc2 may be a middle voltage that falls between the second upper electrode voltage Va2 and the second lower electrode voltage Vb2. Because the second middle electrode voltage Vc2 is applied to the middle layer 72 of the wafer W, an electric field between the upper electrode 51 and the lower electrode 52 can be adjusted. For example, the physical energy of the reactors R bombarding the middle layer 72 of the wafer W may be controlled. Therefore, damage to the middle layer 72 can be alleviated or reduced.

Referring to FIGS. 1 and 4C, a method of processing the wafer W using the substrate processing apparatus 100 may include applying a third upper electrode voltage Va3 to the upper electrode 51, applying a third lower electrode voltage Vb3 to the lower electrode 52, and applying a third middle electrode voltage Vc3 to the middle electrode 53 to perform the substrate processing process in a third period. The third upper electrode voltage Va3 may be a ground voltage or a negative (−) voltage, the third lower electrode voltage Vb3 may be a positive (+) voltage, and the third middle electrode voltage Vc3 may be a negative (−) voltage. For example, the third middle electrode voltage Vc3 may be a voltage having the same polarity as the third upper electrode voltage Va3. The middle electrode voltages Vc1-Vc3 may be changed or varied between the upper electrode voltages Va1-Va3 and the lower electrode voltages Vb1-Vb3.

Because the third middle electrode voltage Vc3 is applied to the middle layer 72 of the wafer W, the bombardment of reactors R with the middle layer 72 of the wafer W may be mitigated, or the physical energy directed to the middle layer 72 of the wafer W may be significantly reduced or weakened.

When processing the wafer W using the substrate processing apparatus 100, damage to a metallic material layer (e.g., the middle layer 72) formed on the wafer W may be alleviated. Accordingly, even if the middle layer 72 is thin, etching processes can be performed in a stable manner, so that fine pattern etching processes and high aspect ratio etching processes can be improved.

According to embodiments of the disclosure, the severity of damage to the metallic hardmask on the wafer can be reduced so that a pattern having a high aspect ratio can be stably formed.

While this disclosure contains many specifics, these should not be construed as limitations on the scope of the present teachings or of what may be claimed, but rather as descriptions of features that may be specific to particular embodiments of the present teachings. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments. Only a few embodiments and examples are described. Other embodiments, enhancements, and variations can be made based on what is described and illustrated in this patent document.

What is claimed is:

1. A wafer processing apparatus for processing a wafer, the apparatus comprising:
    a vacuum chamber;
    a wafer supporting unit including a wafer supporting plate for supporting the wafer, wherein the wafer supporting plate is disposed at a lower portion of an inside of the vacuum chamber; and
    an electric field forming unit forming an electric field inside the vacuum chamber,
    wherein the electric field forming unit includes:
    an upper electrode disposed at an upper portion of the inside of the vacuum chamber;
    a lower electrode disposed in the wafer supporting unit; and
    a middle electrode disposed adjacent to the wafer supporting plate between the upper electrode and the lower electrode,
    wherein the middle electrode includes a metallic body portion with a vertical pillar shape and an end portion with a rounded distal end covered with an insulating material,
    wherein the insulating material covering the end portion of the middle electrode is configured to be directly in contact with the wafer on the wafer supporting plate to form a capacitive connection.

2. The apparatus of claim 1, further comprising a controller configured to apply voltages to the upper electrode, the lower electrode, and the middle electrode.

3. The apparatus of claim 1, further comprising a gas supplying unit including a gas delivery pipe and a gas distribution unit comprising a plurality of gas injection openings disposed in the upper portion of the inside of the vacuum chamber,
    wherein the upper electrode is disposed above the gas distribution unit.

4. The apparatus of claim 1, wherein:
    the wafer supporting unit includes an actuator configured to move the wafer supporting plate, and
    the lower electrode is disposed in the wafer supporting plate.

5. The apparatus of claim 1, wherein the middle electrode is disposed adjacent to an upper surface of the wafer supporting plate.

6. The apparatus of claim 1, wherein the electric field forming unit includes at least two middle electrodes disposed along a periphery of the wafer supporting plate.

7. The apparatus of claim 1, wherein the end portion tapers from the metallic body portion to the distal end to have an inclined side surface.

8. The apparatus of claim 1, wherein:
    the wafer supporting unit includes an edge ring disposed on the wafer supporting plate, and
    the middle electrode is adjacent to the edge ring.

9. The apparatus of claim 8, wherein the middle electrode penetrates the edge ring.

10. The apparatus of claim 1, wherein the end portion extends from an end of the body portion.

11. A wafer processing apparatus for processing a wafer, the apparatus comprising:
    a vacuum chamber;
    a wafer supporting unit including a wafer supporting plate disposed at a lower portion of an inside of the vacuum chamber;
    an electric field forming unit forming an electric field inside the vacuum chamber,
    wherein the electric field forming unit includes:
    an upper electrode disposed at an upper portion of the inside of the vacuum chamber;
    a lower electrode disposed in the wafer supporting unit; and
    a middle electrode disposed between the upper electrode and the lower electrode,
    wherein the middle electrode includes a body portion with a rod shape, extending in a horizontal direction, and an end portion with a bent shape, extending in a vertical direction,
    wherein the end portion of the middle electrode is covered with an insulating material,
    wherein the insulating material covering the end portion of the middle electrode is configured to be directly in contact with the wafer on the wafer supporting plate to form a capacitive connection.

12. The apparatus of claim 11, wherein the end portion has an elbow shape including a rounded downward vertex.

13. The apparatus of claim 11, wherein the end portion has a sliding bar shape at an angle to the body portion.

14. The apparatus of claim 11, wherein the end portion extends from an end of the body portion.

15. A wafer processing apparatus for processing a wafer, the apparatus comprising:
    a vacuum chamber;

a wafer supporting unit including a wafer supporting plate for supporting the wafer, wherein the wafer supporting plate is disposed at a lower portion of an inside of the vacuum chamber; and an electric field forming unit forming an electric field inside the vacuum chamber, wherein the electric field forming unit includes:

an upper electrode disposed at an upper portion of the inside of the vacuum chamber;

a lower electrode disposed in the wafer supporting unit; and a middle electrode between the upper electrode and the lower electrode, wherein the middle electrode includes a metallic body portion and an end portion covered with an insulating material, wherein the insulating material covering the end portion of the middle electrode is directly in contact with the wafer on the wafer supporting plate to form a capacitive connection.

* * * * *